(12) United States Patent
Ho et al.

(10) Patent No.: US 7,608,889 B2
(45) Date of Patent: Oct. 27, 2009

(54) LATERAL DIFFUSION METAL-OXIDE-SEMICONDUCTOR STRUCTURE

(75) Inventors: Dah-Chuen Ho, Taichung (TW);
Chien-Shao Tang, Hsinchu (TW);
Zhe-Yi Wang, Hsinchu (TW);
Yu-Chang Jong, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 97 days.

(21) Appl. No.: 11/864,278

(22) Filed: Sep. 28, 2007

(65) Prior Publication Data

US 2009/0085112 A1    Apr. 2, 2009

(51) Int. Cl.
*H01L 29/78*    (2006.01)
(52) U.S. Cl. ............................. 257/343; 257/E29.256

(58) Field of Classification Search ......... 257/335–343, 257/E29.256, E29.261
See application file for complete search history.

(56) References Cited

U.S. PATENT DOCUMENTS 6,861,702 B2 *   3/2005   Kitamura .................... 257/330

* cited by examiner

*Primary Examiner*—Marcos D. Pizarro
(74) *Attorney, Agent, or Firm*—WPAT, P.C.; Anthony King

(57) ABSTRACT

A lateral diffusion metal-oxide-semiconductor (LDMOS) structure comprises a gate, a source, a drain and a shallow trench isolation. The shallow trench isolation is formed between the drain and the gate to withstand high voltages, applied to the drain, and is associated with the semiconductor substrate to form a recess. As such, the surface of the shallow trench isolation is lower than the surface of the semiconductor substrate. Optionally, the surface of the shallow trench isolation is lower than the surface of the semiconductor substrate by 300-1500 angstroms.

20 Claims, 4 Drawing Sheets

LATERAL DIFFUSION METAL-OXIDE-SEMICONDUCTOR STRUCTURE

BACKGROUND OF THE INVENTION (A) Field of the Invention

The present invention relates to a transistor, and more specifically to a Lateral Diffusion Metal-Oxide-Semiconductor (LDMOS) structure related to high-voltage applications.

(B) Description of Related Art

Some of today's hottest products, such as flat panel displays, require high-voltage chips. A commonly used high-voltage device for these applications is the LDMOS transistor or the so-called Drain-Extended MOS. It has the advantages of process compatibility with VLSI process and is easily integrated with other processing.

For high-voltage devices, a specific "on" resistance and breakdown voltage are critical to device performance. A design goal of the LDMOS device is to minimize "on" resistance, while still maintaining a high breakdown voltage. However, these two electrical parameters tend to have conflicting requirements.

FIG. 1 illustrates a high-voltage LDMOS device 1. An N-well 11, a P-well 12 and a P-well 13 are formed in a P-substrate 10. A gate 16 and an oxide layer 161 are formed above the P-substrate 10. Spacers 162 are formed on the sidewalls of the gate 16. A silicide layer 163 may be further formed on the gate 16 as an optional process step. An $N^+$ region 14 is formed in the P-well 12, and another $N^+$ region 15 is formed in the N-well 11. The $N^+$ region 14 serves as a source, whereas the $N^+$ region 15 serves as a drain. The gate 16, the $N^+$ region 14 and the $N^+$ region 15 form an NMOS transistor. Shallow trench isolations (STI) 17 are formed to isolate transistors. In order to withstand high voltages applied to the $N^+$ region 15 (drain), a shallow trench isolation 18 is further formed between the gate 16 and the $N^+$ region 15 to avoid current leakage or cross-talk issues.

The process for manufacturing the shallow trench isolation 18 and the gate structure including the oxide layer 161, the gate 16 and the silicide layer 163 of the LDMOS device 1 is illustrated in FIGS. 2 and 3. In FIG. 2, the shallow trench isolation 18 is formed in a substrate 10, and a sacrificial oxide layer 20 is formed on the substrate 10 to avoid the channel effect that may be caused by subsequent implantations. In FIG. 3, the implantations transform the substrate 10 into the N-well 11, the $N^+$ region 14 and the $N^+$ region 15. Then, the sacrificial oxide layer 20 is removed, and the gate oxide layer 161, the gate 16 and the silicide layer 163 are formed in sequence. Normally, the sacrificial oxide layer 20 is removed by etching with an over-etching percentage of around 20-30% to ensure the sacrificial oxide layer 20 is removed completely. For example, if the thickness of the sacrificial oxide layer 20 is 110 angstroms, the etch time is determined to etch the sacrificial oxide layer 20 to a depth of 133 angstroms.

In consideration of high voltages applied to the LDMOS, the improvement to high breakage voltage is highly demanded but low resistance still needs to be maintained or further improved.

SUMMARY OF THE INVENTION

These and other problems are generally solved or circumvented, and technical advantages are generally achieved, by advantageous embodiments of the present invention, which provides an LDMOS structure that can increase the threshold voltage and decrease the "on" resistance. In other words, the new LDMOS structure of the present invention not only minimizes "on" resistance but also increases breakdown voltage though these two electrical parameters tend to have conflicting requirements.

A lateral diffusion metal-oxide-semiconductor (LDMOS) structure in accordance with an embodiment of the present invention comprises a semiconductor substrate including a gate, a source, a drain and a shallow trench isolation. The shallow trench isolation is formed between the drain and the gate to withstand high voltages, e.g., 40V or 50V, applied to the drain, and is associated with the semiconductor substrate to form a recess, i.e., the shallow trench isolation is concave. As such, the surface of the shallow trench isolation is lower than the surface of the semiconductor substrate. The gate includes a first portion on the shallow trench isolation and a second portion on the semiconductor substrate, and the bottom of the first portion is lower than the bottom of the second portion; in other words, the gate 47 extends from the surface of the shallow trench isolation to the surface of the semiconductor substrate with a step therebetween. In an embodiment, the surface of the shallow trench isolation is lower than the surface of the semiconductor substrate by 300-1500 angstroms.

In order to avoid the channel effect during implantation from forming the source and the drain, a sacrificial oxide layer is formed on the semiconductor substrate before the implantation and will be removed by etching afterwards. Because both the sacrificial oxide layer and the shallow trench isolation are composed of silicon oxide material, the concave shallow trench isolation can be formed by increasing the time required to etch the sacrificial oxide layer.

As to the more detailed manufacturing process for the LDMOS structure, a sacrificial oxide layer is formed on a semiconductor substrate with a shallow trench isolation before the source and the drain in the semiconductor substrate are formed. The sacrificial oxide layer and the shallow trench isolation are etched with a larger over-etching percentage, by which a surface of the shallow trench isolation is lower than a surface of the semiconductor substrate. Thereafter, a gate is formed on the semiconductor substrate.

The foregoing has outlined rather broadly the features and technical advantages of the present invention in order that the detailed description of the invention that follows may be better understood. Additional features and advantages of the invention will be described hereinafter, which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

The advantages of the present invention will become apparent upon reading the following description and upon reference to the accompanying drawings in which.

DETAILED DESCRIPTION OF THE INVENTION

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely, a LDMOS structure. The principles of the present invention, however, may also be applied to other semiconductor devices of like construction and integrated circuits, in general.

Figure 1:
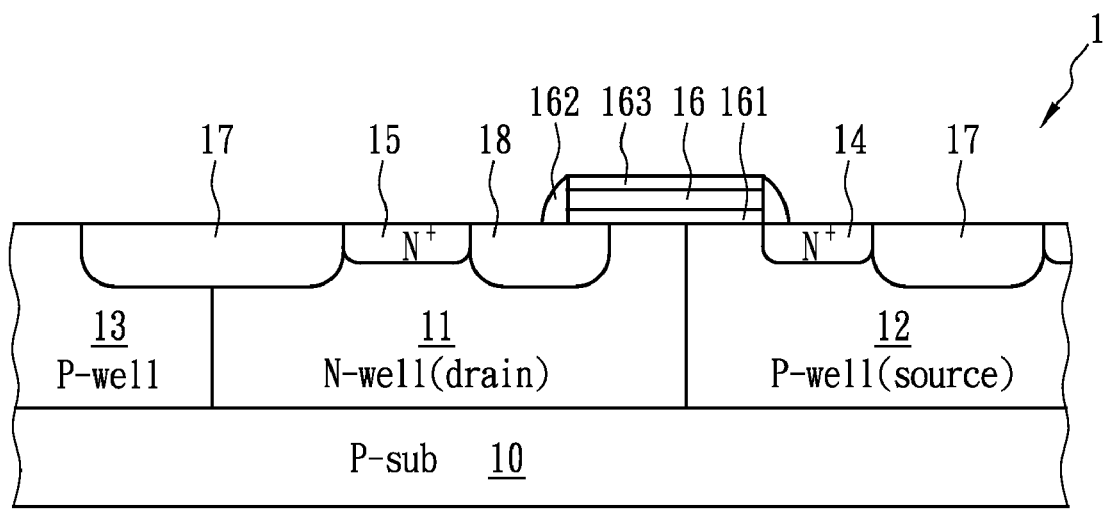
FIG. 1 illustrates a known LDMOS structure.
Figure 2:
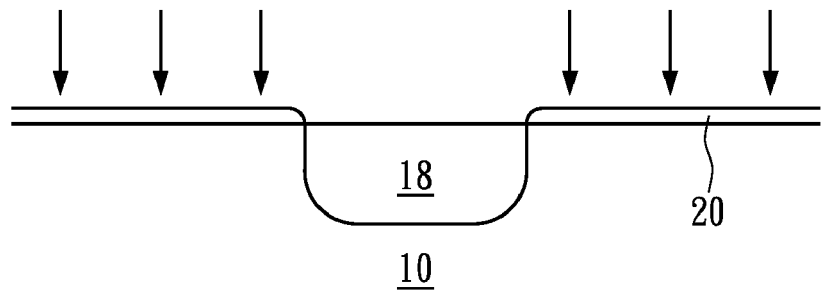
FIGS. 2 and 3 illustrate a known process to manufacture an LDMOS structure.
Figure 3:
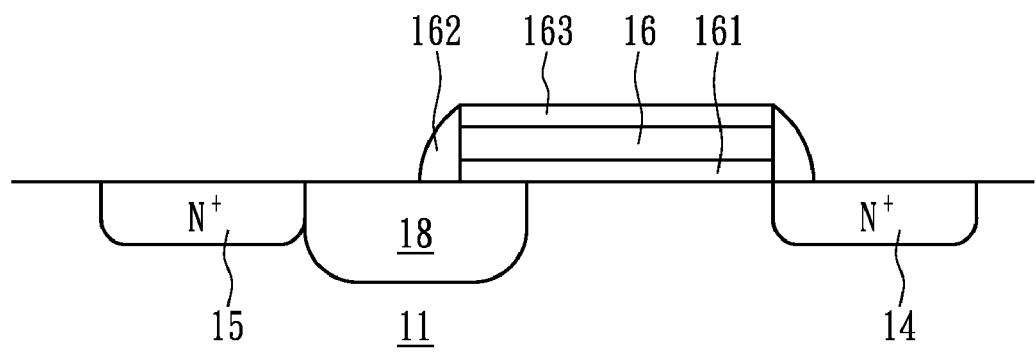
Figure 4:
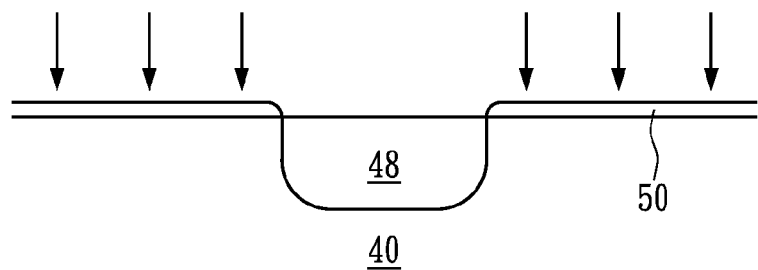
FIGS. 4 through 7 illustrate the LDMOS manufacturing process in accordance with an embodiment of the present invention.
Figure 5:
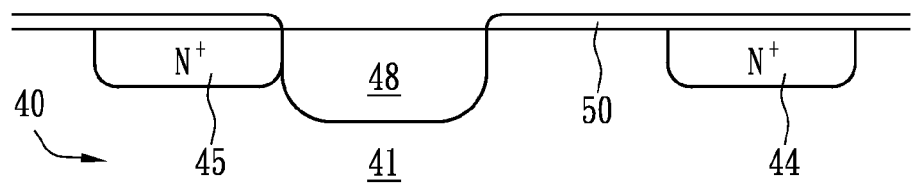
Figure 6:
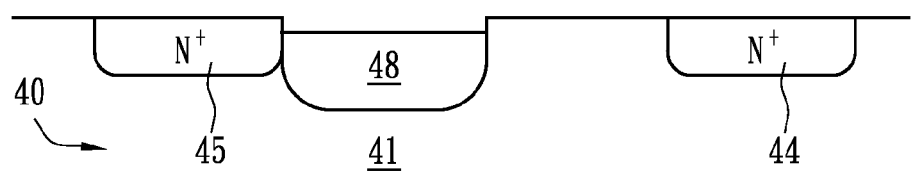

FIGS. 4 through 6 illustrate the LDMOS process in a high voltage area in accordance with an embodiment of the present invention. In FIG. 4, a shallow trench isolation 48 is formed in a semiconductor substrate 40 employing lithography, dry etching and dielectric deposition processes. The dry etching may be reactive etching or plasma etching, which are well known and widely accepted practices by those skilled in the art. The semiconductor substrate 40 includes the shallow trench isolation 48 formed by conventional processes such as low pressure chemical vapor deposition (CVD), plasma enhanced chemical vapor deposition (PECVD) or high density plasma chemical vapor deposition (HDP CVD) oxide filling in shallow trenches. A sacrificial oxide layer 50 is formed on the semiconductor substrate 40 by, for example, thermal oxidation for protection to the substrate 40 in the sequential implantation process. The thermal oxidation is preferably performed in a furnace at a high temperature to form the sacrificial oxide layer 50, i.e., a thermal growth oxide layer.

In FIG. 5, the semiconductor substrate 40 is subjected to implantations to form an N-well 41, an $N^+$ region 44 and an $N^+$ region 45 in the semiconductor substrate 40. In the present embodiment, a process of constructing the LDMOS transistor, e.g., N-type MOS, is illustrated and described. It should be noted that the processes described herein are equally applicable to other types of transistors in general. Typically, to form the N-type regions 41, 44 and 45 of the transistor, arsenic ions are implanted into the substrate 40. Other types such as antimony and phosphorous may also be employed to form the N-type regions 41, 44 and 45.

In FIG. 6, the sacrificial oxide layer 50 is removed by either drying etching or wet etching. The dry etching may use anisotropic etching based on carbon-fluoride gases. The wet etching may use solution of hydrofluoric acid such as buffer oxide etchant (BOE) or buffer solution of hydrofluoric acid (BHF). To ensure that the sacrificial oxide layer 50 is removed completely, a recess on the shallow trench isolation 48 is intentionally formed. Therefore, the etching time for removing the sacrificial oxide layer 50 is increased. As such, the shallow trench isolation 48 (STI oxide) is recessed; namely there is a step between the surface of the shallow trench isolation 48 and the semiconductor substrate 40.

In an embodiment, the thickness of the sacrificial oxide layer 50 is around 110 angstroms, and the etching time needed to etch the sacrificial oxide layer 50 to a level of 500 angstroms is determined, i.e., the over-etching percentage is between 300-400%. Because the shallow trench isolation 48 is composed of silicon oxide, the shallow trench isolation 48 will be etched also while the sacrificial oxide layer 50 is being removed. As a result, the surface of the shallow trench isolation 48 will be lower than the surface of the N-well 41 or the semiconductor substrate 40, so that the shallow trench isolation 48 is concave. In an embodiment, the top of the shallow trench isolation 48 is lower than the top of the semiconductor substrate 40 by 300-1500 angstroms. In the case employing dry etching, most of the etchers are equipped with endpoint systems to detect the timing of the layer to be etched is removed completely. Therefore, those skilled in the art can determine the over-etching percentage in the endpoint system directly rather than calculate the etching time manually. The endpoint system would more precisely control the over-etching time, and spontaneously calculate the actual over-etching time to cover the process variation of wafers. It should be noted that the over-etching percentage of 300-400% is only exemplified, the actual over-etching percentage can be changed for those skilled in the art in response to different processes or designs.

Figure 7:
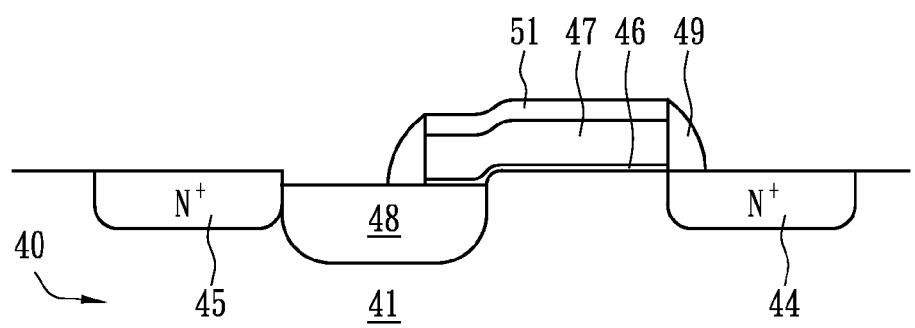

In FIG. 7, an oxide layer 46, a gate 47 and a silicide layer 51 are formed on the surfaces of the N-well 41 and the shallow trench isolation 48 by known methods for those skilled in the art. For instance, the oxide layer 46, the gate 47 and the silicide layer 51 are in sequence deposited by, for example, CVD processes first, and are patterned by anisotropic etching. Then, spacers 49 are formed on both sides of the gate structure by deposition of dielectric such as oxide or nitride and an anisotropic etching thereto. The spaces 49 taper toward the top of the silicide layer 51. In this embodiment, the oxide layer 46 has a thickness of 300 angstroms, the gate 47 is a polysilicon gate, and the silicide layer 51 may be composed of titanium silicide for 0.25 μm process or copper silicide for 0.18 μm process. It can be seen that the gate 47 comprises a first portion on the shallow trench isolation 48 and a second portion on the semiconductor substrate 40, and the bottom of the first portion is lower than the bottom of the second portion. In other words, the gate 47 extends from the surface of the shallow trench isolation to the surface of the semiconductor substrate with a step therebetween.

In a preferred embodiment of the present invention, the bottom of the gate 47 on the shallow trench isolation is lower than the top of the N-well 41 at a distance of between 300-1500 angstroms. Because the oxide layer 46 is formed underneath the gate 47, the distance between the bottom of the gate 47 and the top of the semiconductor substrate 40 is slightly smaller than the distance between the top of the shallow trench isolation 48 and the top of the semiconductor substrate 40.

As to a current LDMOS design, the shallow trench isolations in low voltage areas are covered by a silicon nitride layer, the concave shallow trench isolations are only formed in high voltage areas and the shallow trench isolations in low voltage areas will be protected while the sacrificial oxide layer is being removed.

Figure 8:
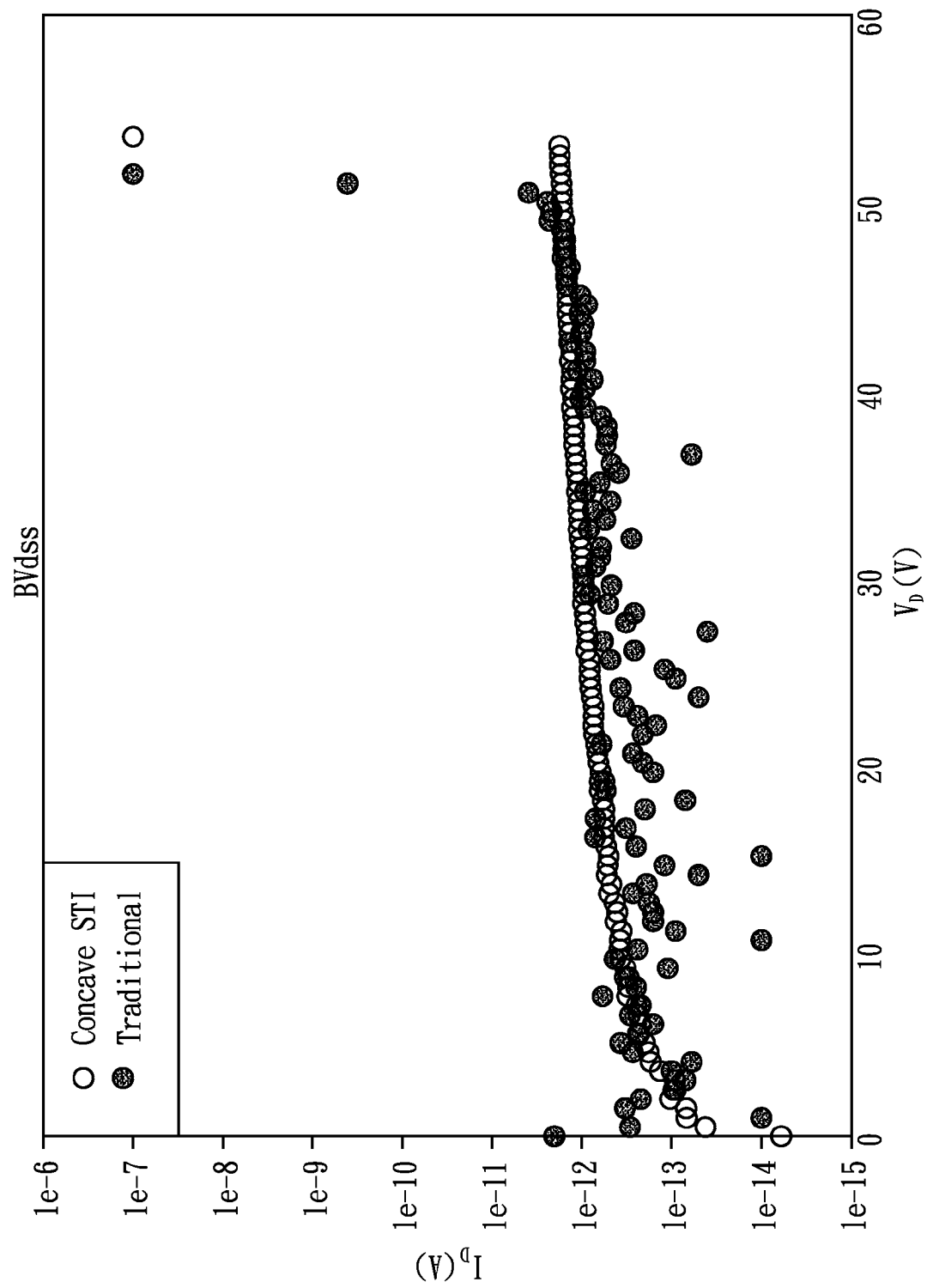
FIG. 8 illustrates the breakdown voltages of the LDMOS of the prior art and the present invention.

FIG. 8 illustrates the breakdown voltage comparison between the prior art and the present invention. The breakdown voltage BVdss is measured under the conditions that gate voltage $V_G$ is equal to 0, source voltage $V_S$ is equal to GND, bulk voltage Vb is equal to GND, and drain voltage $V_D$ is gradually increased. It can be found that the breakdown voltage of the present LDMOS is increased by 8% compared to prior art LDMOS.

Figure 9:
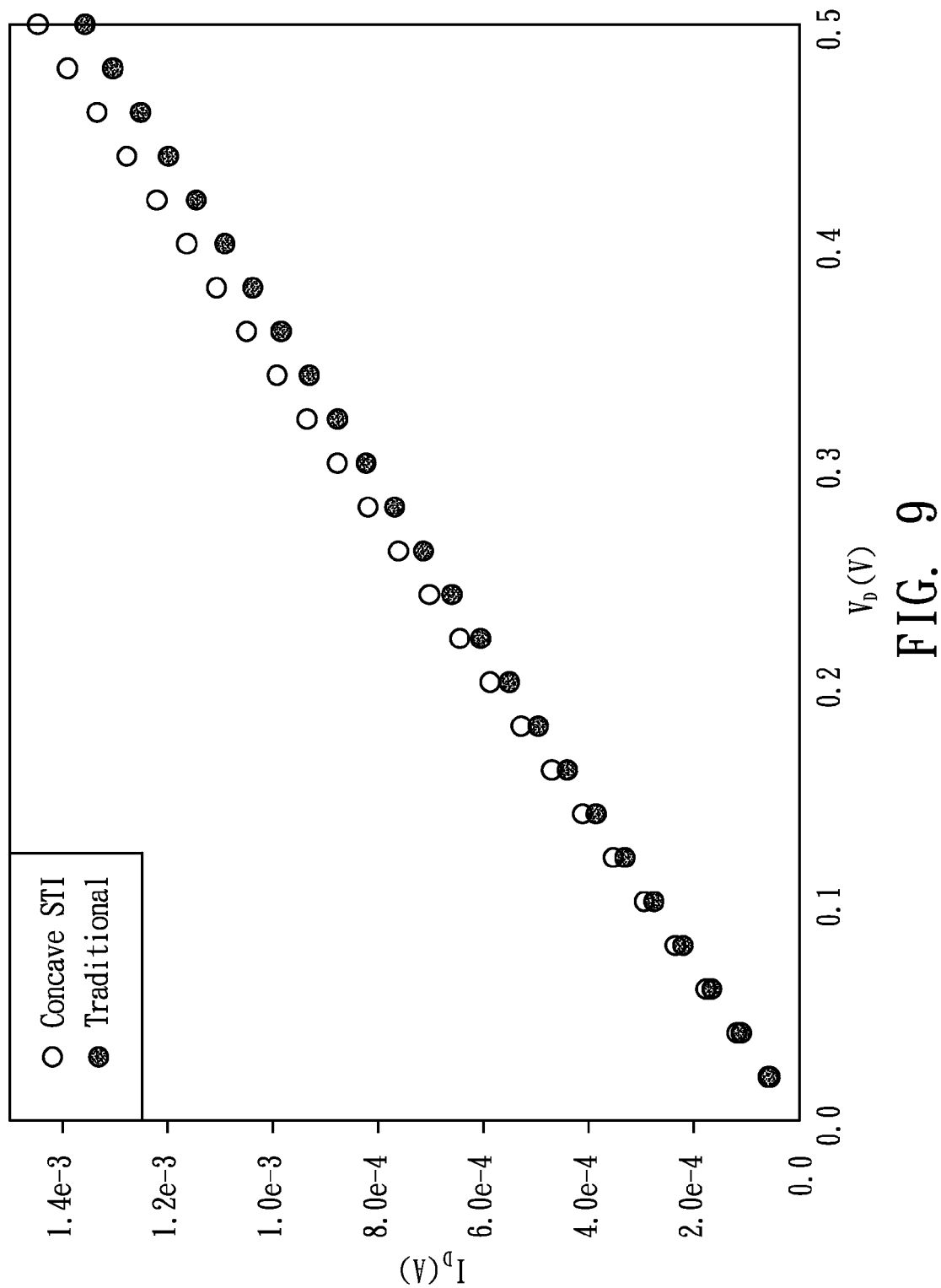
FIG. 9 illustrates the "on" resistances of the LDMOS of the prior art and the present invention.

FIG. 9 illustrates a comparison of LDMOS I-V curves for the prior art and the present invention. The current $I_D$ is measured under the condition that $V_G$ is equal to Vcc and $V_D$ is equal to 0.1V. The "on" resistance is proportional to $V_D/I_D$, so the "on" resistance can be obtained by $V_D$ and $I_D$. The "on" resistance of the present invention is decreased by around 10% in comparison with that of the prior art.

Accordingly, the new design of the present LDMOS structure not only minimizes "on" resistance, but also increases breakdown voltage. In addition, because the concave shallow trench isolation can be formed by simply extending the time to etch the sacrificial oxide layer, an additional lithography step is not required. In other words, LDMOS performance can be improved without an extra lithographic mask, and thus the manufacturing cost is not increased.

Also, although the present invention and its advantages have been described in detail, it should be understood that various changes, substitutions and alterations can be made herein without departing from the spirit and scope of the invention as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A lateral diffusion metal-oxide-semiconductor (LDMOS) structure, comprising:
    a gate formed on a semiconductor substrate;
    a source formed in the semiconductor substrate;
    a drain formed in the semiconductor substrate;
    a shallow trench isolation formed in the semiconductor substrate and between the drain and the gate, wherein a top surface of the shallow trench isolation is lower than a top surface of the semiconductor substrate; and
    a step disposed between the top surface of the shallow trench isolation and the top surface of the semiconductor substrate.

2. The LDMOS structure in accordance with claim 1, wherein the top surface of the shallow trench isolation is lower than the top surface of the semiconductor substrate by 300-1500 angstroms.

3. The LDMOS structure in accordance with claim 1, wherein the gate comprises polysilicon.

4. The LDMOS structure in accordance with claim 1, further comprising an oxide layer interposed between the gate and the top surface of the shallow trench isolation.

5. The LDMOS structure in accordance with claim 1, wherein the shallow trench isolation is used to withstand high voltages applied to the drain.

6. The LDMOS structure in accordance with claim 1, wherein the gate comprises a bottom surface on the top surface of the shallow trench isolation, and the bottom surface of the gate on the top surface of the shallow trench isolation is lower than the top surface of the semiconductor substrate.

7. The LDMOS structure in accordance with claim 6, wherein the bottom surface of the gate on the top surface of the shallow trench isolation is lower than the top surface of the semiconductor substrate by 300-1500 angstroms.

8. A LDMOS structure, comprising:
    a source formed in a semiconductor substrate;
    a drain formed in the semiconductor substrate;
    a gate comprising a bottom surface; and
    a shallow trench isolation formed in the semiconductor substrate and between the drain and the source, wherein the shallow trench isolation comprises a top surface lower than a top surface of the semiconductor substrate;
    wherein the gate comprises a first portion on the top surface of the shallow trench isolation and a second portion on the top surface of the semiconductor substrate, and wherein the bottom surface of the first portion of the gate is lower than the top surface of the semiconductor substrate.

9. The LDMOS structure in accordance with claim 8, wherein the bottom surface of the first portion of the gate is lower than the top surface of the semiconductor substrate by 300-1500 angstroms.

10. The LDMOS structure in accordance with claim 8, wherein the gate comprises polysilicon.

11. The LDMOS structure in accordance with claim 8, further comprising an oxide layer underlying the gate.

12. The LDMOS structure in accordance with claim 8, wherein the shallow trench isolation is used to withstand high voltages applied to the drain.

13. The LDMOS structure in accordance with claim 8, wherein the top surface of the shallow trench isolation is flat.

14. The LDMOS structure in accordance with claim 13, wherein the top surface of the shallow trench isolation is lower than the top surface of the semiconductor substrate by 300-1500 angstroms.

15. A LDMOS structure, comprising:
    a source formed in a semiconductor substrate;
    a drain formed in the semiconductor substrate;
    a gate; and
    a shallow trench isolation formed in the semiconductor substrate and between the drain and the source, and the shallow trench isolation having a top surface below a top surface of the semiconductor substrate; and
    wherein the gate extends over a step between the top surface of the isolation structure and the top surface of the semiconductor substrate.

16. The LDMOS structure in accordance with claim 15, wherein the step is between 300-1500 angstroms.

17. The LDMOS structure in accordance with claim 15, wherein the gate comprises polysilicon.

18. The LDMOS structure in accordance with claim 15, further comprising an oxide layer underlying the gate.

19. The LDMOS structure in accordance with claim 15, wherein the top surface of the shallow trench isolation is flat.

20. The LDMOS structure in accordance with claim 19, wherein the top surface of the shallow trench isolation is lower than the top surface of the semiconductor substrate by 300-1500 angstroms.

* * * * *